(12) United States Patent
Neo et al.

(10) Patent No.: US 6,859,060 B2
(45) Date of Patent: Feb. 22, 2005

(54) INSPECTION METHOD OF SEMICONDUCTOR DEVICE AND INSPECTION SYSTEM

(75) Inventors: Yoichiro Neo, Kokubunji (JP); Mari Nozoe, Hino (JP)

(73) Assignee: Hitachi, Ltd., Tokyo (JP)

(*) Notice: Subject to any disclaimer, the term of this patent is extended or adjusted under 35 U.S.C. 154(b) by 0 days.

(21) Appl. No.: 10/172,925

(22) Filed: Jun. 18, 2002

(65) Prior Publication Data

US 2003/0071646 A1 Apr. 17, 2003

(30) Foreign Application Priority Data

Oct. 17, 2001 (JP) .................................. 2001-319249

(51) Int. Cl.⁷ .......................... G01R 31/26; G01R 1/04
(52) U.S. Cl. ................................ 324/765; 324/158.1
(58) Field of Search ............................. 324/750–753, 324/765, 158.1; 250/309–311, 306–307; 356/394; 382/145, 149, 141

(56) References Cited

U.S. PATENT DOCUMENTS

| | | | | |
|---|---|---|---|---|
| 4,736,159 A | * | 4/1988 | Shiragasawa et al. | 324/752 |
| 6,002,792 A | * | 12/1999 | Oguri et al. | 324/750 |
| 6,329,826 B1 | * | 12/2001 | Shinada et al. | 324/751 |
| 6,344,750 B1 | * | 2/2002 | Lo et al. | 324/751 |
| 6,504,393 B1 | * | 1/2003 | Lo et al. | 324/765 |
| 6,509,750 B1 | * | 1/2003 | Talbot et al. | 324/750 |
| 6,559,663 B2 | * | 5/2003 | Shinada et al. | 324/751 |
| 6,566,897 B2 | * | 5/2003 | Lo et al. | 324/751 |
| 6,583,634 B1 | * | 6/2003 | Nozoe et al. | 324/751 |
| 6,586,952 B2 | * | 7/2003 | Nozoe et al. | 324/751 |
| 2003/0057971 A1 | * | 3/2003 | Nishiyama et al. | 324/751 |

* cited by examiner

Primary Examiner—David Zarneke
Assistant Examiner—Jermele Hollington
(74) Attorney, Agent, or Firm—Antonelli, Terry, Stout & Kraus, LLP

(57) ABSTRACT

An inspection technique for enabling an inspection on a wafer at an early stage during a wafer process. A wafer in a process is irradiated with an electron beam a plurality of times at predetermined intervals under a condition that a junction is backward biased, and secondary electron signals are monitored, so as to evaluate relax time characteristic of a backward bias potential in a p-n junction. Since the potential in the p-n junction decreases according to the intensity of a backward bias current in intermittent time, a backward bias current can be specified from an intensity signal interrelated with the number of secondary electron signals, that is, a potential contrast image on the basis of image information.

13 Claims, 12 Drawing Sheets

INSPECTION METHOD OF SEMICONDUCTOR DEVICE AND INSPECTION SYSTEM

FIELD OF THE INVENTION

The present invention relates to an inspection technique in a semiconductor device manufacturing line and, more particularly, to an inspection technique in a manufacturing line of a semiconductor device having a junction.

BACKGROUND OF THE INVENTION

The following methods of inspecting a connection state (open/short) of a pn junction by using an electron beam and an open/close state of a contact hole related to a pn junction in a semiconductor device manufacturing process are disclosed.

Japanese Patent Application Laid-Open No. 4-151846 discloses that an open/short-circuit defect of a connection part of a pn junction is found from a voltage contrast image.

Japanese Patent Application Laid-Open No. 11-121561 discloses that an open defect or a short-circuit defect of a contact portion of a pn junction is obtained from a voltage contrast image.

Japanese Patent Application Laid-Open No. 2000-208579 discloses that electric connectivity of a contact hole formed over a p-diffusion layer and an n-diffusion layer is obtained from a voltage contrast image.

Semiconductor device manufacturers have been requesting for measurement of electric characteristics of a pn junction at some midpoint in a wafer process of a semiconductor device. However, none of the above-described prior arts have proposed a method of addressing the request.

None of the above-described prior arts also have proposed a method of detecting and controlling process fluctuations in a wafer process comprised of a plurality of processes at an early stage.

SUMMARY OF THE INVENTION

An object of the invention is, therefore, to provide an inspection technique of a semiconductor device, enabling an inspection on a semiconductor wafer to be performed at an early stage during a wafer process in manufacture of a semiconductor device, and capable of promptly grasping a problem with accuracy and taking a countermeasure on a manufacturing process immediately.

The invention has been achieved by paying attention that the intensity of a potential contrast signal obtained after formation of a pn junction changes according to a backward bias current in the pn junction, founding out a method of specifying a backward bias current from the potential contrast signal, and determining whether parameters of a semiconductor device are adapted or not by using the method.

Specifically, the surface of a semiconductor wafer in which a pn junction is formed is irradiated with an electron beam a plurality of times at predetermined intervals under condition that the junction is backward biased, secondary electron signals generated are detected, and an image is formed from the secondary electron signals and monitored, thereby evaluating relax time characteristics of the backward bias potential in the pn junction. Since the potential in the pn junction decreases according to the intensity of the backward bias current in intermittent time, the backward bias current can be specified from an intensity signal interrelated with the number of secondary electron signals, that is, a potential contrast signal on the basis of image information.

The invention has been achieved by paying attention that variations in the characteristics of a device produced occur according to the degree of adjustment of a process in a semiconductor device manufacturing process at the time of determining whether the process is successfully performed or not and finding out a method capable of detecting the variations at an early stage in the manufacturing process. That is, whether the process is successfully performed or not is determined in a non-contact manner by irradiating a chip in a wafer with an electron beam and specifying a backward bias current as a characteristic of a junction by using a contrast distribution of a secondary electron image obtained by the irradiation.

According to the invention, manufacturing conditions in a plurality of processes are changed as parameters, and the optimum conditions of the process are specified.

A typical configuration example of an inspection method and an inspection system of a semiconductor device in accordance with the invention will be described hereinbelow.

According to the invention, there is provided an inspection method of a semiconductor device, including: a step of irradiating a substrate surface of a semiconductor device in which a circuit pattern is formed with a primary charged particle beam a plurality of times at predetermined intervals; a step of detecting an electron signal secondarily generated from the substrate by irradiation of the primary charged particle beam; a step of displaying an image from the electron signals detected; a step of extracting a potential contrast signal from information of the image displayed; and a step of specifying electric characteristics of the semiconductor device from the potential contrast signal. Further, in the configuration, the inspection method further includes a step of specifying a backward bias current in the semiconductor device from the potential contrast signal, and is characterized in that electric characteristics of the semiconductor device are specified from the backward bias current.

According to the invention, there is also provided an inspection method of a semiconductor device, including: a step of irradiating a substrate surface of a semiconductor device in which a circuit pattern is formed with a primary charged particle beam a plurality of times at predetermined intervals at a stage during a wafer process; a step of detecting a signal secondarily generated from the substrate by irradiation of the primary charged particle beam; a step of displaying an image from the signals detected; a step of extracting a potential contrast signal from information of the image displayed and obtaining a sample average and distribution of the potential contrast signal; and a step of specifying electric characteristics of the semiconductor device from the potential contrast signal. Further, in the configuration, the inspection method further includes a step of obtaining the potential contrast signal distribution by extracting the potential contrast signals from a plurality of positions in the substrate and specifying a backward bias current distribution of the semiconductor device from the potential contrast signal distribution, and is characterized in that electric characteristics of the semiconductor device are specified from the backward bias current distribution.

According to the invention, there is also provided an inspection method of a semiconductor device, including: a step of irradiating a surface of a semiconductor wafer having a circuit pattern in which a junction is formed with an electron beam a plurality of times at predetermined intervals under a condition that the junction is backward biased; a step of detecting a secondary electron signal generated from the wafer by irradiation of the electron beam; a step of displaying an image from the secondary electron signals detected; a step of extracting a potential contrast signal from information of the image displayed; a step of specifying a backward bias current in the junction from the potential contrast signal; and a step of specifying electric characteristics of the semiconductor device from the backward bias current. Further, in the configuration, the inspection method further includes: a step of obtaining a potential contrast signal distribution by extracting the potential contrast signal from a plurality of positions in the semiconductor wafer; and a step of specifying a backward bias current distribution of the junction from the potential contrast distribution, and is characterized in that electric characteristics of the semiconductor device are specified on the basis of the backward bias current.

Further, according to the invention, there is also provided an inspection method of a semiconductor device, including: a step of irradiating a substrate surface of a semiconductor device in which a circuit pattern is formed with a primary charged particle beam a plurality of times at predetermined intervals at a stage in a wafer process; a step of detecting an electron signal secondarily generated from the substrate surface by irradiation of the primary charged particle beam; a step of displaying an image from the electron signals detected; and a step of obtaining a potential contrast signal distribution by extracting a potential contrast signal from information of the image displayed, and is characterized in that a backward bias current distribution of the semiconductor device is specified by using the potential contrast signal distribution of a semiconductor device whose electric characteristics are known, and electric characteristics of the semiconductor device are specified.

Further, the invention provides an inspection system of a semiconductor device, including: an electron source; an electron beam irradiating unit for irradiating a substrate of a semiconductor device having a circuit pattern in which a junction is formed with an electron beam; a sample holder for holding the substrate; a detector for detecting an electron signal secondarily generated by irradiation of the substrate with the electron beam; display means for displaying an image of the electron signal detected; control means for executing a control so as to irradiate the substrate with the electron beam a plurality of times at predetermined intervals; and signal processing means for extracting a potential contrast signal from information of the image displayed and specifying a backward bias current of the semiconductor device from the potential contrast signal, wherein electric characteristics of the semiconductor device are specified from the backward bias current.

DETAILED DESCRIPTION OF THE PREFERRED EMBODIMENTS

Embodiments of the invention will be described in detail hereinbelow with reference to the drawings.

First Embodiment

In a first embodiment, an inspection method and an inspection system for inspecting a backward bias in a semiconductor wafer being in a manufacturing process will be described.

Figure 1:
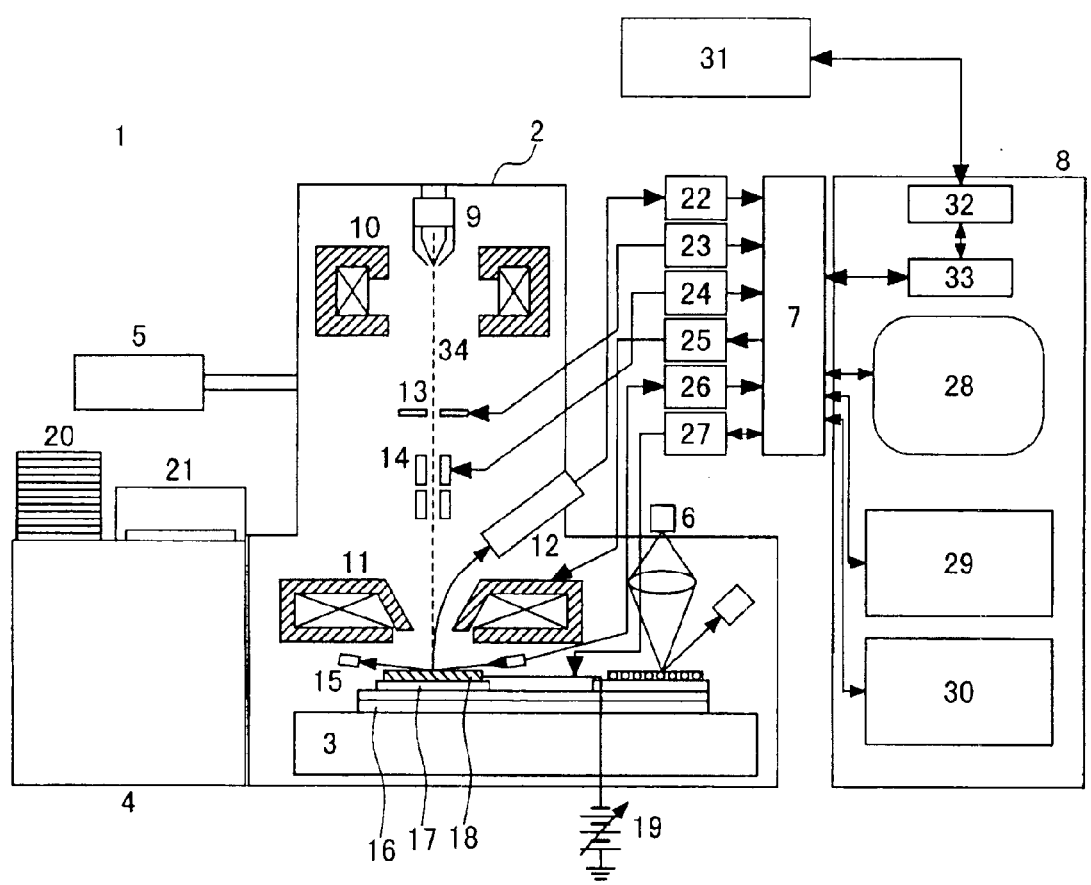
FIG. 1 is a diagram showing the configuration of an embodiment of a semiconductor inspection system according to the invention.

FIG. 1 shows the configuration of an inspection system for a semiconductor device in the embodiment. An inspection system 1 for a semiconductor device includes an electron beam optics unit 2, a stage unit 3, a wafer handling unit 4, a vacuum unit 5, an optics microscope unit 6, a control unit 7, and a control unit 8.

The electron beam optics unit 2 includes an electron gun 9, a condenser lens 10, an object lens 11, a detector 12, a blanking deflector 13, a deflector 14, and a wafer height measure sensor 15.

The stage unit 3 includes an XY stage 16, a wafer holder 17 (sample holder) on which a wafer 18 is to be mounted, and a retarding power supply 19 for applying a negative voltage to the wafer holder 17 and the wafer 18. A position detector for laser measurement is attached to the XY stage 16.

The wafer handling unit 4 is constructed by a wafer case 20 and a wafer loading unit 21. The wafer holder 17 on which the wafer 18 is mounted travels between the wafer loading unit 21 and the XY stage 16.

The control unit 7 is constructed by a signal detection control unit 22, a beam deflector control unit 23, a blanking control unit 24, an electron beam optics control unit 25, a height measurement unit 26, and a stage control unit 27.

The control unit 8 serving as signal processing means is constructed by a graphical user interface and user interface unit 28, an image processing unit 29, a data storage unit 30, a data input unit 32 for transferring/receiving data to/from an outer server 31, and a data translate unit 33.

Figure 2:
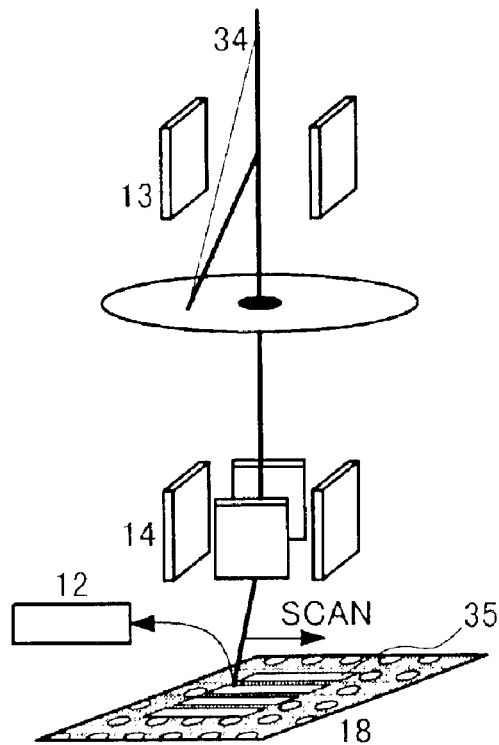
FIG. 2 is a conceptual diagram enlargedly showing an electron beam irradiating unit.

FIG. 2 is an enlarged view of the electron beam optics unit 2 in FIG. 1. The timing of irradiating the wafer 18 with a primary electron beam 34 is controlled by the blanking deflector 13. At the time of irradiating the wafer 18 with the primary electron beam 34, a scanning speed and a beam scanning region 35 are controlled by the deflector 14, and a signal is detected by the detector 12 in accordance with scanning speed.

An inspection method for evaluating a backward bias current will now be described in detail hereinbelow.

Figure 3:
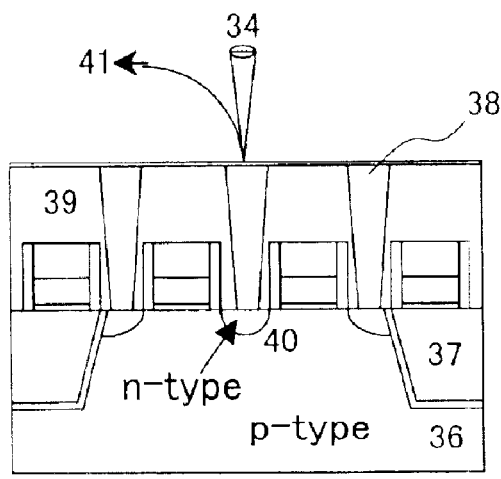
FIG. 3 is a diagram showing an object to be inspected.

FIG. 3 is a conceptual diagram of an action in the case where a wafer is irradiated with the primary electron beam 34. The structure of a sample is that a shallow trench isolation 37 is formed in a substrate 36, and transistors are isolated from each other by the shallow trench isolation 37. In a transistor part, a hole pattern in which a plug pattern 38 is buried exists. The substrate 36 and the plug 38 are conductive and the plug pattern is surrounded by an insulator layer 39. In the substrate part under the plug pattern 38, a pn junction 40 is formed. In the embodiment, a p-type substrate is used as a substrate and a polysilicon film in which an n-type ion is doped is used as a plug burying material.

Such a sample is irradiated with the primary electron beam 34. For the irradiation energy of the electron beam, a condition that a secondary electron emission efficiency of the plug 38 is higher than 1 is selected. In the example, irradiation energy is set to 500 eV. The electron beam current is set to 500 pA, and the beam scanning speed and a signal sampling clock are set to 100 MHz. The irradiation parameters can be arbitrarily set within a designation range. For example, the electron beam current can be set within a range from 10 pA to 100 nA determined by required resolution and limitation of an electron beam amount. The sampling clock can be set within the range from the lower limit of 100 kHz to the upper limit of 100 MHz regulated by realistic measurement time.

When the sample is irradiated with an electron beam with the above parameters, secondary electrons 41 are generated more than the emitted electron beam 34. As a result, the plug pattern 38 is charged positively. Although the plug 38 is conductive with the substrate 36, since the pn junction 40 exists and is backward biased, supply of electrons from the substrate 36 is extremely small. Consequently, the charges are relaxed slowly. However, when the backward bias current increases in the pn junction, the supply of electrons from the substrate 36 becomes relatively large, so that the relax time of the positive charges of the plug 38 is shortened. The charge relax time varies according to the charge amount and the backward bias current amount of the plug 38.

By referring to FIG. 4, an electron beam irradiating method for specifying a backward bias current will be described. FIG. 4 shows a state of decrease in a charged voltage in the case where a transistor is irradiated with an electron beam a plurality of times successively. As inspection parameters, an acceleration voltage is set to 500V, an electron beam current is set to 5 nA, and scanning speed and sampling clock are set to 100 MHz so that a plug charging voltage is not saturated by beam irradiation of once. With the parameters, the same transistor is irradiated with the electron beam a plurality of times.

Figure 4A:
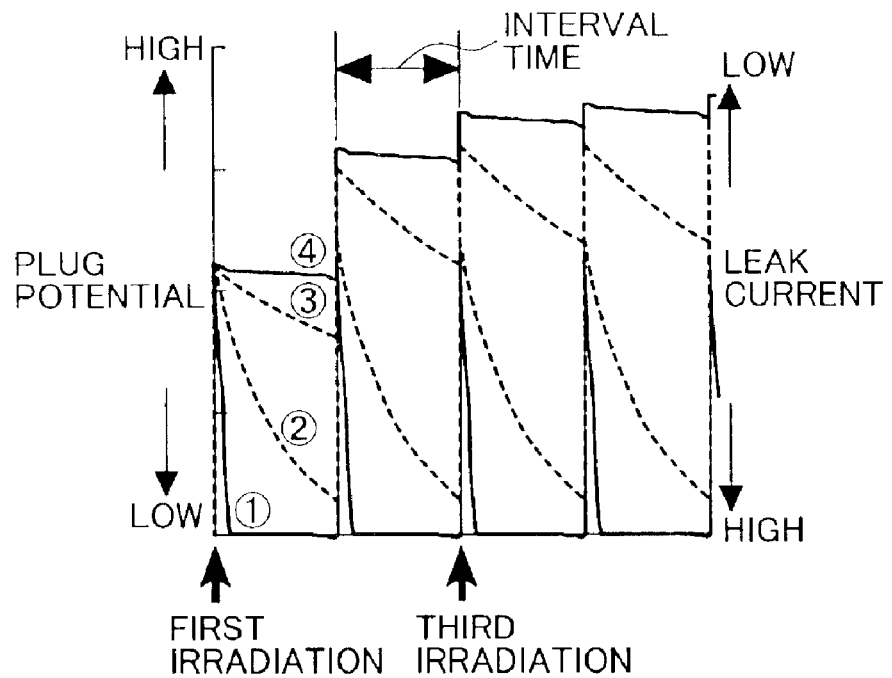
FIG. 4A is a diagram showing a voltage change at the time of inspection.

FIG. 4A shows a state of a change in a plug potential when an electron beam is irradiated a plurality of time at predetermined time intervals. The vertical line denotes a potential of the plug, and the horizontal line denotes time. The backward bias current (corresponding to leak current in the diagram) decreases in order of ①, ②, ③, and ④ shown in the drawing. As indicated by ① in the drawing, in the case of a junction having a high backward bias current, the charging is completely relaxed within intermittence time. However, as shown by ②, ③, and ④ in the drawing, as the backward bias current becomes lower, the charging is not completely relaxed and the potential becomes higher. Further, since the next irradiation of an electron beam starts, by irradiation of an electron beam a plurality of times, the potential further increases and, as a result, the plug potential increases in accordance with order of ④, ③, ②, and ①.

Figure 4B:
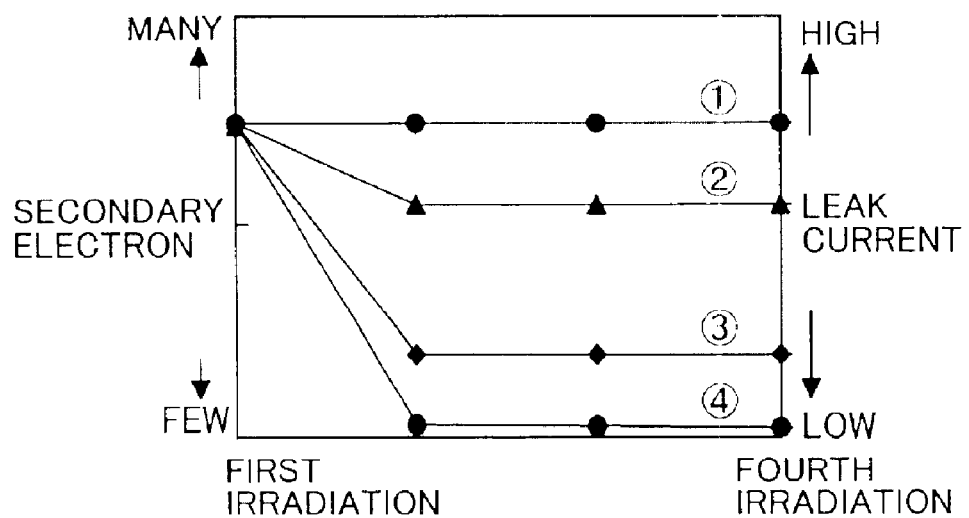
FIG. 4B is a diagram showing a change in a secondary electron signal amount at the time of inspection.

FIG. 4B shows a change in the amount of the secondary electron signals emitted in ①, ②, ③, and ④ with the inspection parameters. By the effect of the potential contrast, when the backward bias current amount is large as shown by ①, the secondary electron signal amount is large. As the backward bias current decreases like ②, ③, and ④, the secondary electron signal amount decreases. It is understood that the secondary electron signal amount is obtained according to the strength of the backward bias current.

Figure 5:
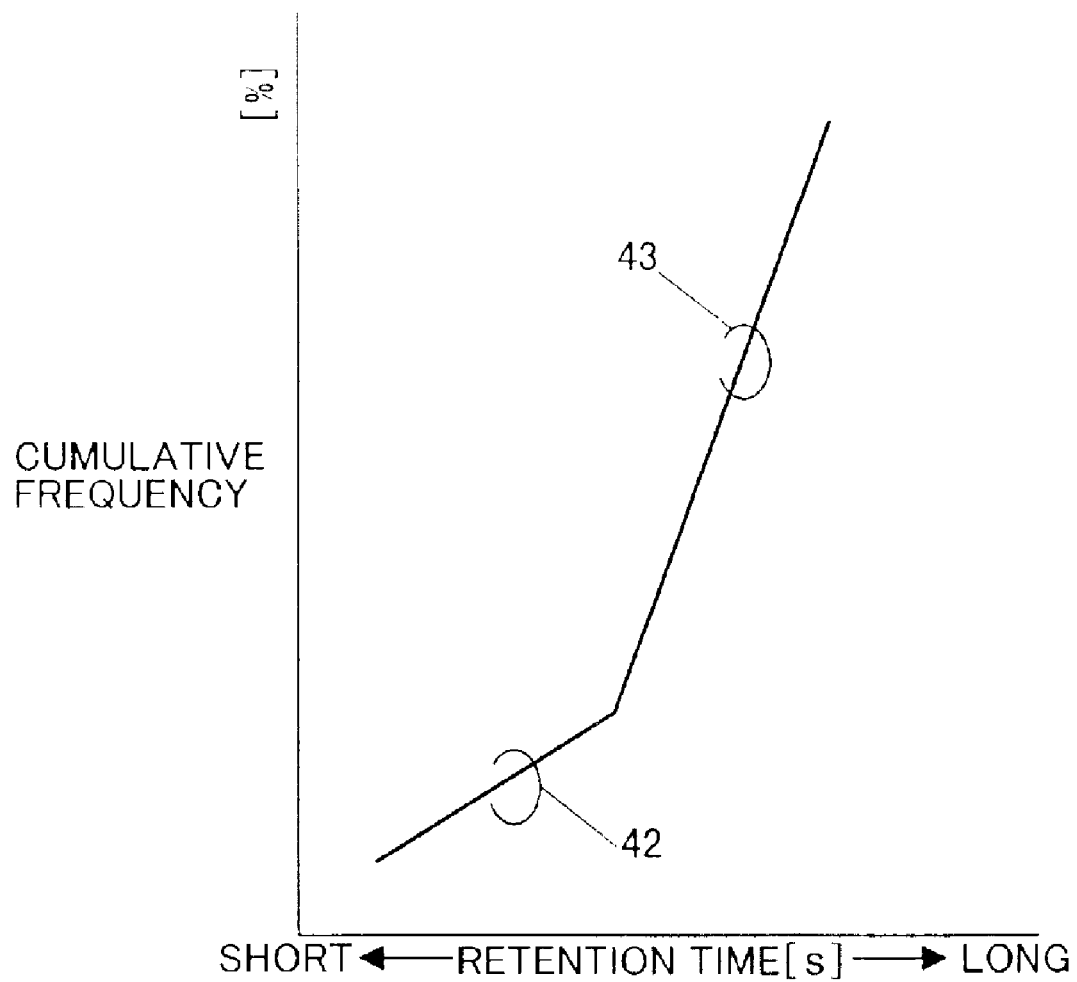
FIG. 5 is a diagram showing a data retention characteristic of a DRAM by a cumulative frequency.

An example of inspecting data retention time of a DRAM (Dynamic Random Access Memory) will now be described. The performance of the DRAM is expressed by a cumulative frequency distribution of data retention time shown in FIG. 5. The data retention time is determined by time in which the charges stored in the capacitor is completely relaxed by a backward bias current, that is, a leak current in the pn junction. The cumulative frequency distribution is constructed by two components; a tail distribution 42 made by bits in which a leak current increases, that is, leak failure bits and a main distribution 43 made by bits having average electric characteristics.

In Japanese Unexamined Patent Application No. 2000-187517 filed by the inventor herein, an object of detection of a leak failure in a pn junction is a retention failure bit (leak failure), and the method does not consider to grasp the characteristics of the main distribution.

Figure 6A:
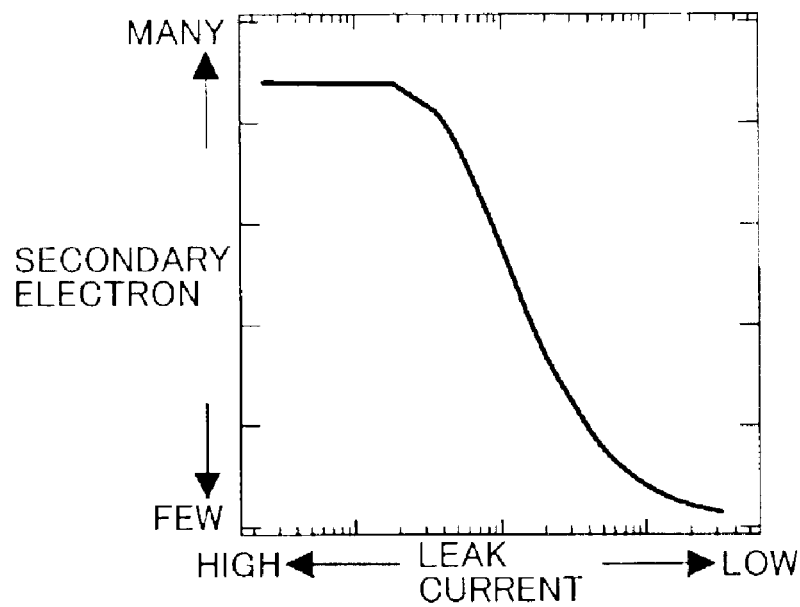
FIG. 6A is a diagram showing the relation between a voltage contrast signal and a leak current.
Figure 6B:
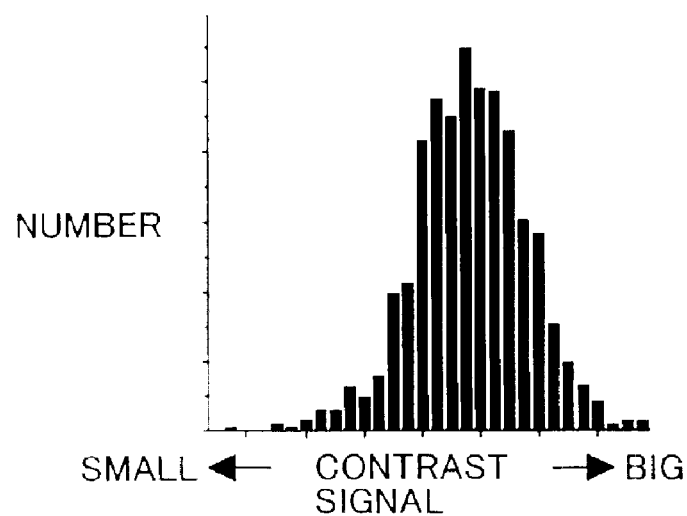
FIG. 6B is a diagram showing a contrast signal distribution extracted from a voltage contrast image.

FIG. 6A shows the relation between a leak current in a charge storing bit junction in a DRAM and a secondary electron signal obtained by the inspection method. From the relation, it is understood that there is a sensitivity region in which the potential contrast signal changes in a region where there is a leak current. By using the relation, a potential contrast signal of each pattern is extracted from a potential contrast image obtained from the test result, and a potential contrast distribution can be generated as shown in FIG. 6B.

Figure 6C:
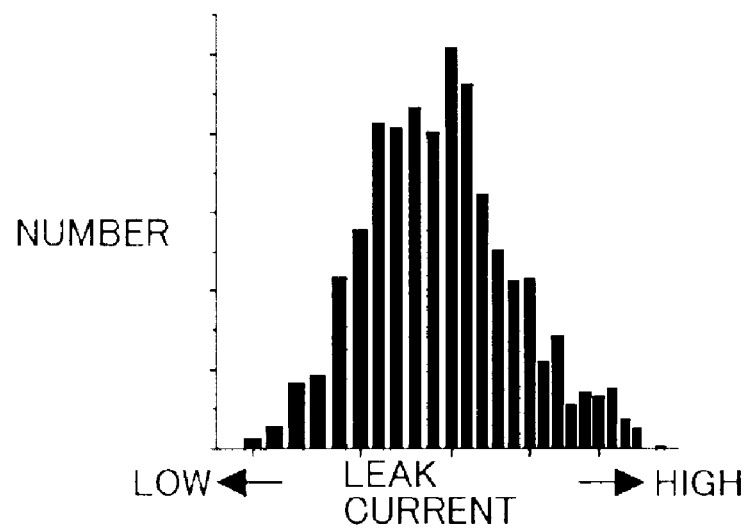
FIG. 6C is a diagram showing a leak current distribution.
Figure 6D:
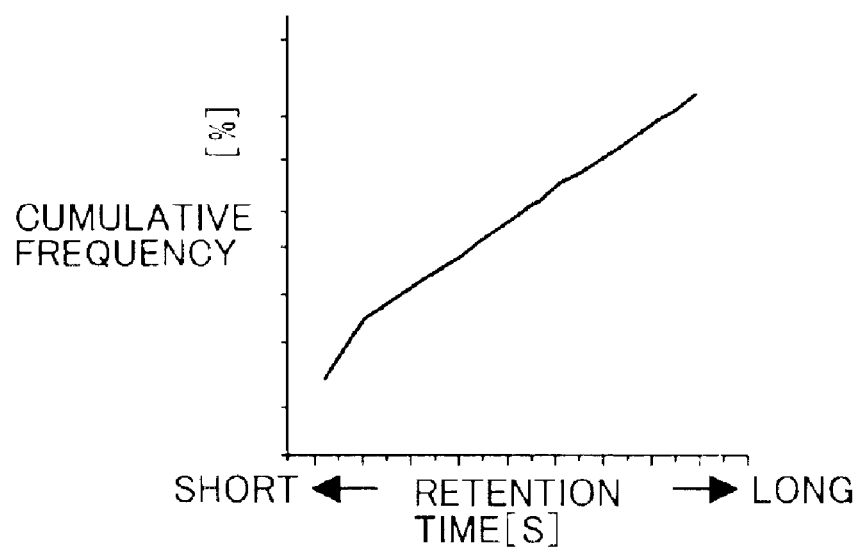
FIG. 6D is a diagram showing a data retention time characteristic evaluation result.

Further, by using the relation of the leak current and the potential contrast signal shown in FIG. 6A, a leak current distribution can be specified as shown by FIG. 6C. Further, by dividing a loss charge permitted for detection of data by a sensor amplifier with a leak current distribution, data retention time can be specified. By displaying the result in the cumulative frequency as shown in FIG. 6D, data retention performance of the DRAM can be easily specified.

Figure 7A:
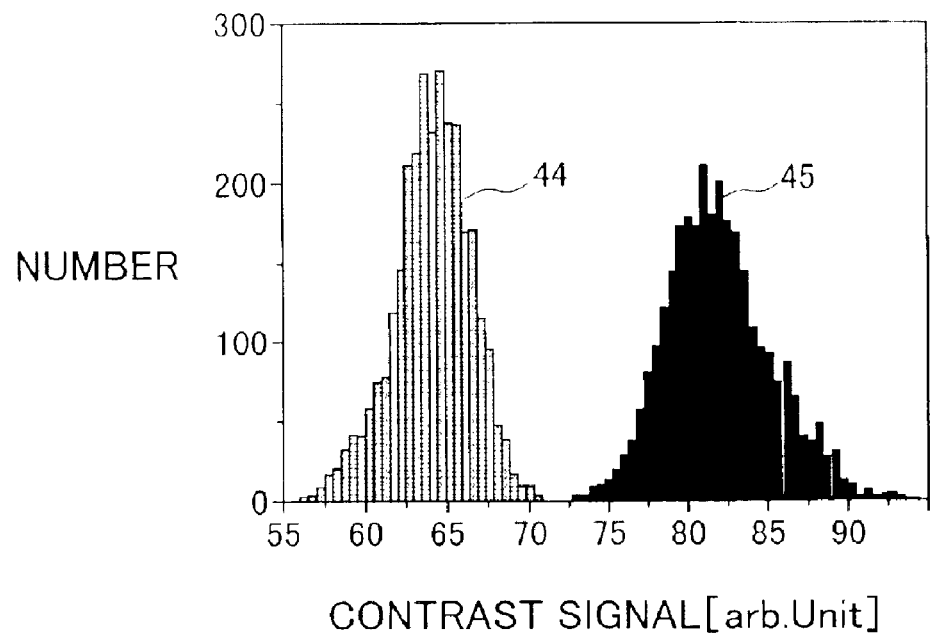
FIG. 7A is a diagram showing a voltage contrast signal distribution.
Figure 7B:
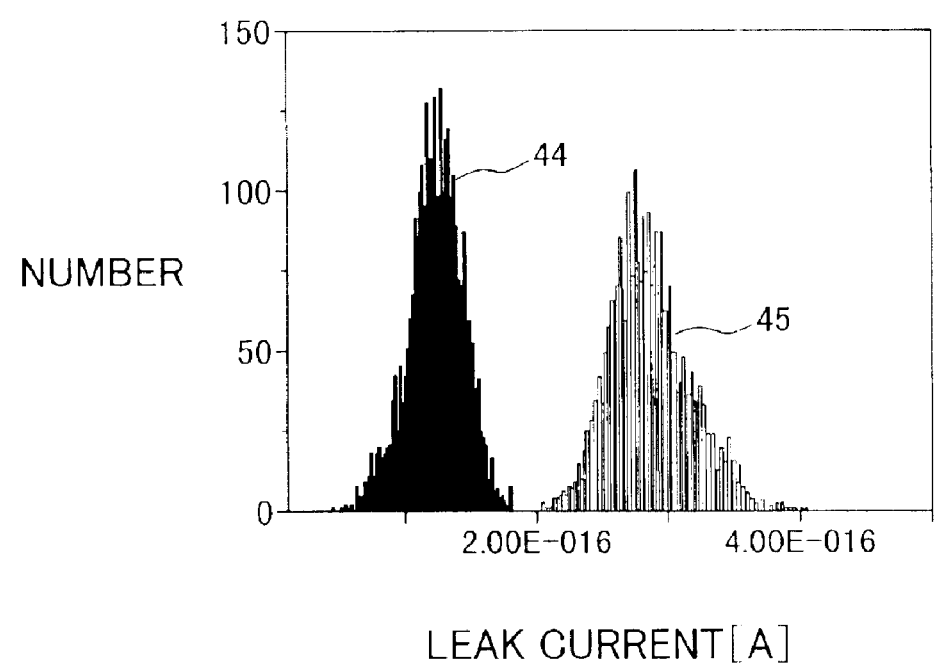
FIG. 7B is a diagram showing a leak current distribution.
Figure 7C:
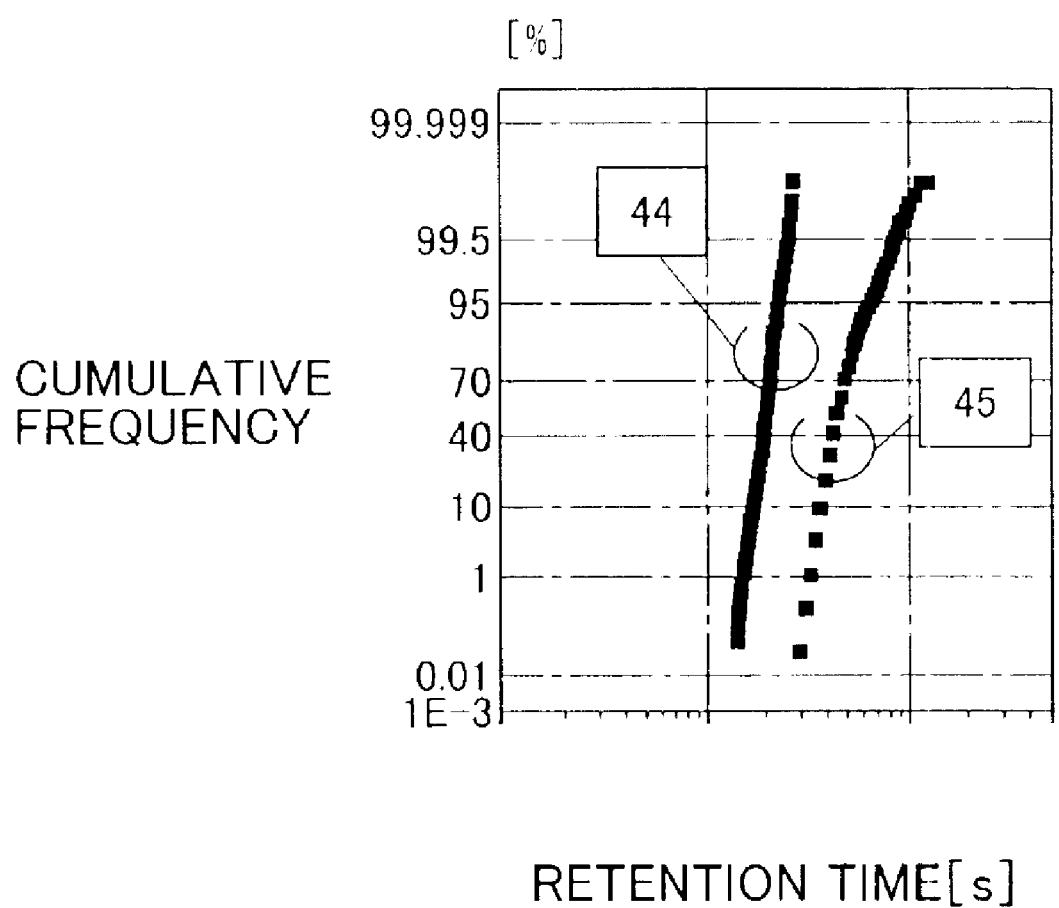
FIG. 7C is a diagram showing a DRAM data retention time measurement result.

FIGS. 7A to 7C show an example of specifying a leak current distribution with high precision from a potential contrast distribution formed by using the inspection system and method described in the embodiment. To make a potential contrast signal and a leak current signal correspond to each other with high precision, a reference is generated. At the time of forming a pn junction, the inspection method is carried out, a wafer subjected to measurement of a potential contrast distribution is returned to a manufacturing process and, after completion of the process, an electrical test is carried out. The result of the electrical test is used as a reference. By using the reference, the leak current and the potential contrast signal are made correspond to each other with high precision.

Subsequently, a sample is evaluated with the same inspection parameters as those for the reference. A potential contrast distribution (44 in FIG. 7A) of the evaluated sample can be transformed into a leak current distribution (44 in FIG. 7B) by using a reference 45. By using the reference, the potential contrast signal and the leak current can be made correspond to each other, so that a leak current of an evaluated sample whose electric characteristics are unknown can be specified. Further, in the DRAM, the data retention characteristics which can be conventionally predicated only after a wafer inspection can be easily predicted (FIG. 7C).

By carrying out the inspection method and sequentially repeating an operation of storing the potential contrast signal, an automatic inspection on a designated region can be conducted. An image of a wafer face and information of a brightness distribution and the like is automatically stored and output after the inspection.

Second Embodiment

By applying the manufacturing method to a semiconductor device manufacturing process, optimum parameters of forming a junction can be determined more efficiently in shorter time as compared with the conventional method. Further, the process parameters for minimizing the leak current can be determined in short time, so that it is effective at improving performances such as reduction in power consumption of a semiconductor device. A case where the inspection method is applied to a semiconductor manufacturing method will be described.

Figure 8:
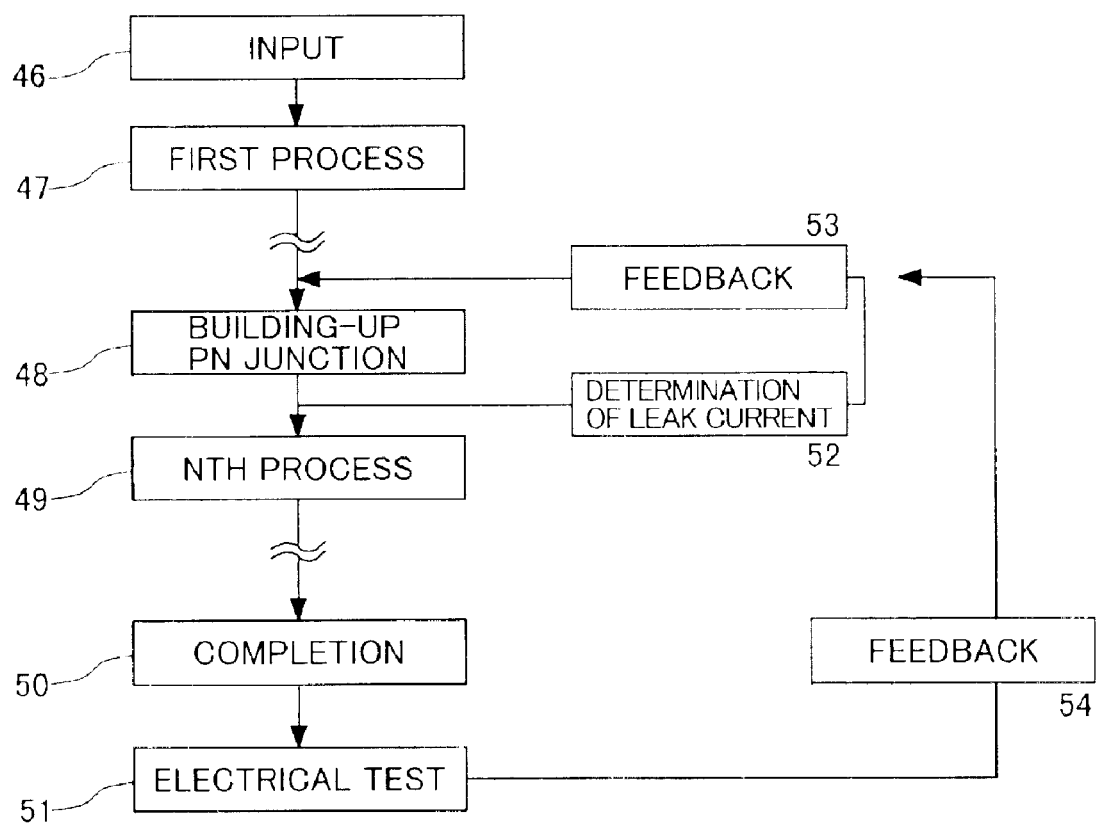
FIG. 8 is a diagram showing a semiconductor manufacturing process flow.

FIG. 8 shows the flow of a semiconductor manufacturing process. In a conventional method, the process is started (step 46) and, after performing various processes, a wafer process is completed (step 50). After an electrical test is conducted (step 51), whether a junction forming process has been performed successfully or not is determined, and a countermeasure to the junction forming process is properly taken (step 54). However, in the conventional method, a period of one to a few months is required to give a feedback (step 54) after a pn junction forming process (step 48). For example, if a backward bias current has increased, products manufactured during the period are defective and, as a result, a large amount of defectives are produced.

The inspection method of the invention is carried out immediately after the pn junction formation (step 52). The result is fed back to the immediately preceding pn junction forming process (step 48) (step 53), thereby shortening the period required to take a countermeasure, which conventionally takes some months to a several days. Thus, the pn junction forming process can be optimized at an early stage. By applying the inspection method and system of the invention, the parameters of manufacturing process of a water to be inspected can be efficiently determined in shorter time with high precision. As a result, a more appropriate process can be used for the manufacturing process, so that the reliability of products can be improved.

In the second embodiment, an example of realizing optimization of the manufacturing process in a short period and shortening the semiconductor device development period by using the inspection system and method described in the first embodiment will be described by using a result of development of a DRAM.

In development of a DRAM, to evaluate the backward bias current in a pn junction at an early stage is very effective at shortening the development period. In present process development, for example, as a method of determining optimum parameters of an impurity profile in a pn junction, temperature and time are used as annealing parameters, a wafer manufactured with a plurality of process parameters is evaluated by an electrical test, and a process of the best data retention characteristics, that is, the lowest backward bias current is selected. According to the method, however, a few months is required to evaluate a backward bias current and feed the result back to a process, so that the long time is an obstacle of shortening of the development period.

By measuring the electric characteristics of a pn junction during the semiconductor manufacturing process by using the inspection method, the feedback period can be shortened, and it contributes to shortening of the development. An example of determining the annealing parameters in formation of a pn junction at the time of development of a DRAM will be described.

Table 1 shows results of the inspection method carried out with the same irradiation parameters on semiconductor substrates each having a pn junction manufactured by using annealing parameters after implantation of impurities under processes conditions of 900° C. and 60 seconds (condition A), 950° C. and 60 seconds (condition B), and 950° C. and 30 seconds (condition C). A sample average and the size of a potential contrast signal distribution were evaluated. It shows that the larger the sample average is, the more the backward bias current increases, and the larger the distribution value is, the more the characteristics vary according to bits.

TABLE 1

Process condition and inspection result

| process condition | sample average | distribution |
|---|---|---|
| A | 80.5 | 5.5 |
| B | 82 | 8 |
| C | 78 | 5 |

From the result, it is understood that the sample average of a potential contrast signal of a wafer of the condition B is slightly larger than that of a wafer of the condition A. It is also understood that the distribution in the wafer of the condition B is larger and the state of a pn junction varies in a wafer face. It is further understood that the sample average of a wafer of the condition C is smaller and the distribution is smaller as compared with those of the conditions A and B. Thus, the condition C is selected for the optimum process.

As described in the above example, the process parameters can be evaluated immediately after a pn junction is formed. By introducing the inspection method of the invention, the period for determining the optimization of the process of forming a pn junction, which conventionally takes half year or longer can be shortened.

Third Embodiment

Figure 9:
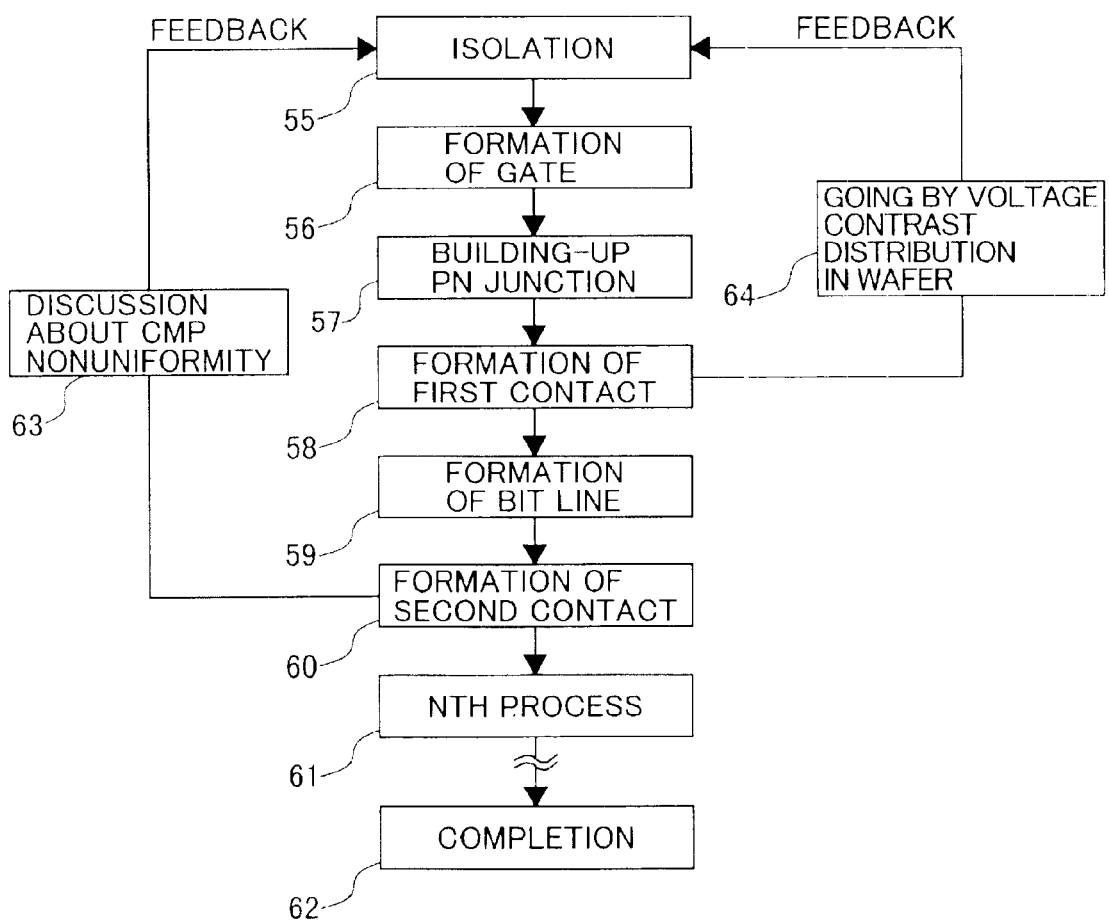
FIG. 9 is a diagram showing a transistor manufacturing process.

In a third embodiment, results and effects of a case of controlling a process by using the inspection system and method described in the first embodiment for in-line monitoring in a semiconductor manufacturing process of a mass production line. FIG. 9 shows a process flow at the time of forming a transistor.

By carrying out the inspection on completion of formation of a first contact (step 58) after formation of a pn junction (step 57) and on completion of formation of a second contact (step 60), an effect is produced on process control, occurrence of a failure in each process can be detected rapidly, and a process in which a failure occurs can be easily estimated or specified.

An example of applying the inspection method after formation of the first contact (step 58) will be mentioned. It is very difficult to specify the cause of a failure of a leak current detected after formation of a first contact. Diffusion of impurity having a distribution which becomes characteristic when a defect occurs will be described here.

At the time of forming a transistor, as materials of a gate, not only polysilicon but also metal materials such as aluminum and tungsten are used. A gate is formed generally by CVD (Chemical Vapor Deposition). After depositing a metal film, a gate line is formed by dry etching such as RIE (Reactive Ion Etching). In the process, an impurity remaining in a chamber becomes a factor of deteriorating the performance of a device. As a concrete cause, the residual impurity in the chamber is adhered to the surface of a wafer and diffused into the substrate by a following heat treatment. A recombination current increases by an impurity level existing in a depletion layer in a pn junction and, as a result, a backward bias current increases. In a device in which a leak current has to be minimized such as a DRAM, the impurity level has to be lowered as much as possible. However, at present, except for inspecting a mixed foreign matter by a scanning electron microscope during a process, there is no way to inspect the impurity. Although the mixed impurity is detected from a result of a wafer inspection, long time of two, three months is necessary until the result is obtained. All of semiconductor devices manufactured during this period include defects of mixed impurity, and a large amount of defectives are manufactured.

Figure 10A:
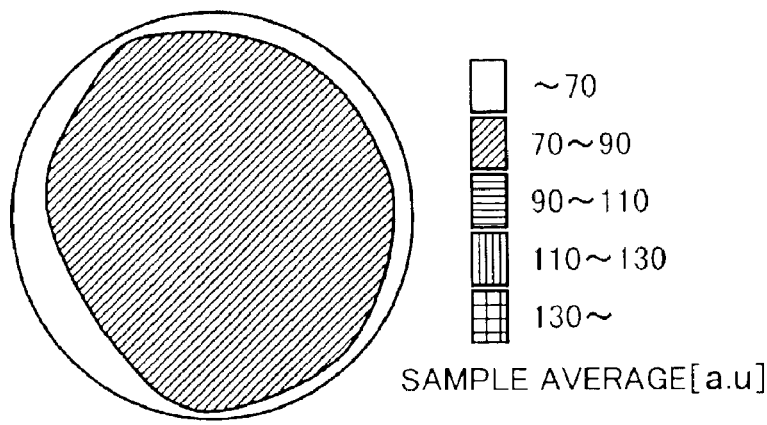
FIG. 10A is a diagram showing a voltage contrast signal sample average distribution in a wafer face.
Figure 10B:
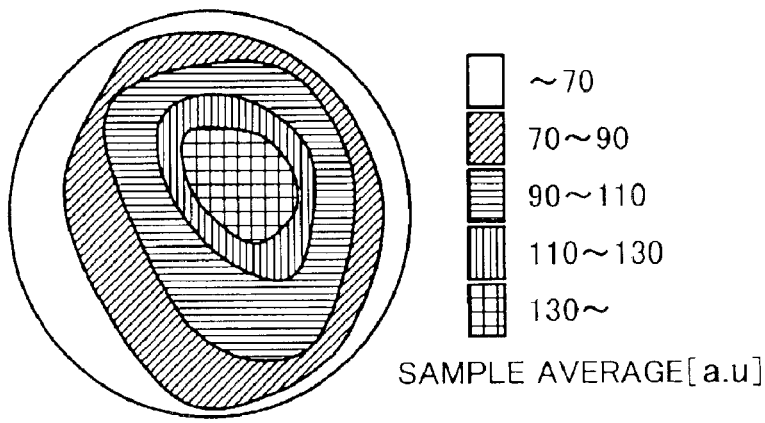
FIG. 10B is a diagram showing a voltage contrast signal sample average distribution in a wafer face.

A result of in-line monitoring of a mixed impurity, in which the inspection method is performed immediately after formation of a pn junction will be described hereinbelow. FIG. 10A shows a result of the inspection made immediately after maintenance of an RIE system in a mass production line. A distribution in a wafer face of a potential contrast sample average of a result of inspection performed on 100,000 DRAM memory bits is shown. FIG. 10B shows a result of the inspection performed after one month since an RIE system operates.

Figure 10C:
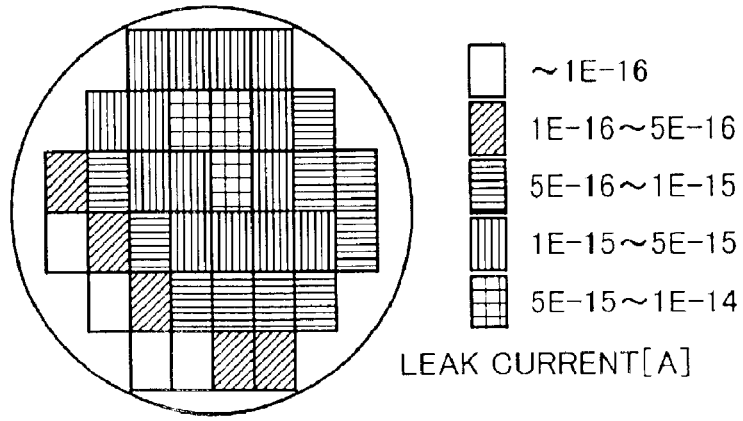
FIG. 10C is a diagram showing a distribution of a leak current occupying 50% of an electric test result.

From the result of the inspection, it is understood that a characteristic distribution in a wafer face of a sample average of a potential contrast signal is not recognized immediately after maintenance but, in FIG. 10B, concentric increase in the potential contrast signal is recognized. FIG. 10C shows a result of a wafer inspection made on an inspected wafer subjected to processes to the final process. It is understood that a leak current occupying 50% in cumulative frequency indication increases concentrically from 1E-16[A] to 1E-14[A] (from $10^{-16}$ [A] to $10^{-14}$ [A]).

It was found out from the above that a leak current has a tendency similar to the result of the wafer inspection. Conventionally, it is experimentally known that a problem of increase in leak current due to mixture of an impurity forms a concentric distribution. The result of the inspection shows a tendency similar to that of a result of a typical wafer inspection of mixed impurity.

As described above, by forming a potential contrast distribution, the cause of a problem can be easily narrowed. It was confirmed that, by using the method, increase in a leak current can be detected at an early stage by in-line monitor and fed back to the process. To accurately grasp the characteristics of a distribution to specify the cause, it is necessary to display the result. By employing the inspection method as a method of controlling the process, occurrence of a problem can be detected at an early stage, so that the productivity of a semiconductor device can be increased.

Further, in the embodiment, the case of introducing the inspection system and method described in the first embodiment as in-line monitoring of a process and specifying a process in which a problem occurs will be described.

An object to be monitored is a polish nonuniformity state in a planarization process at the time of forming a second contact (step 60 in FIG. 9). Concretely, as shown in FIG. 9, at a stage after a multilayer electrode forming process, after forming a bit line (step 59 in FIG. 9) in a first contact (step 58 in FIG. 9) connected to a pn junction, monitoring is performed in a planarization process at the time of forming a second contact (step 60 in FIG. 9).

As a process of planarizing a contact material, CMP (Chemical Mechanical Polish) is used. With respect to the polish nonuniformity of the CMP, by a sampling test of wafers in a manufacturing process, in about five inspection regions in the wafer face, the cross section is observed by SEM or TEM to evaluate the film thickness. However, it takes time to form a sample to carry out an inspection of the cross section, so that it is difficult to increase the inspection regions in the wafer face. An inspection cannot be performed on all of wafers but is carried out on sampled wafers. Further, a wafer once inspected cannot be returned to a process and is discarded.

In the case where the thickness of an interlayer insulating film is not uniform, an increase in temperature of a junction face at the time of annealing performed after the CMP process varies. At the time of employing the inspection method as in-line monitoring, attention is paid to the fact that the anneal temperature nonuniformity exerts an influence on an impurity profile of a pn junction.

Figure 11A:
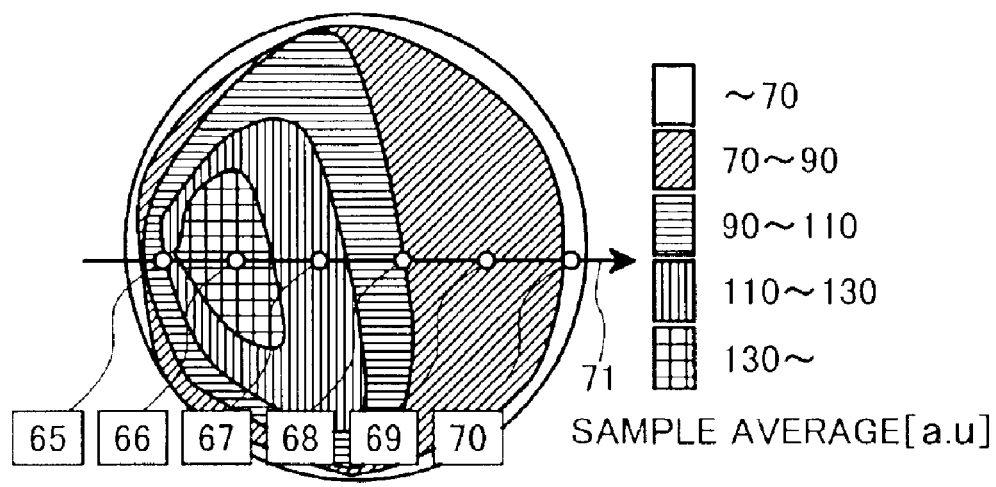
FIG. 11A is a diagram showing a voltage contrast signal sample average distribution in a wafer face.
Figure 11B:
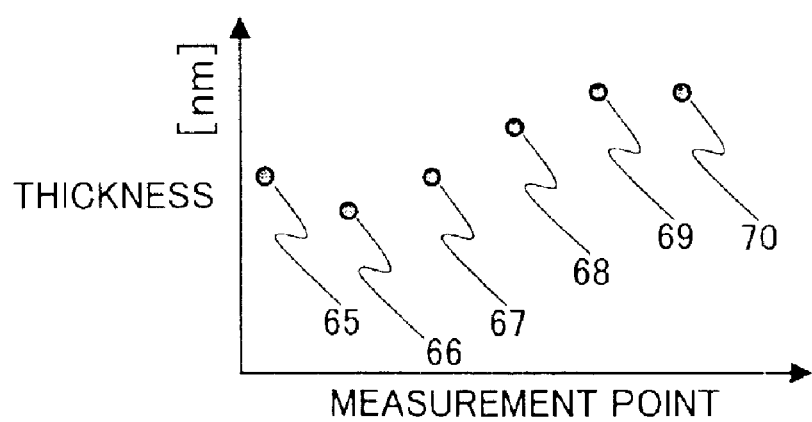
FIG. 11B is a diagram showing a result of film thickness measurement.

FIG. 11A shows a potential contrast signal sample average distribution in a wafer. From the result of the inspection, it is understood that the sample average has a distribution in a wafer face deviated to a region. FIG. 11B shows a result of observation of cross sections of a plurality of samples formed in the direction shown by 71 in FIG. 11A. It is understood from the result that the tendency of a change in thickness of an interlayer insulating film coincides with the tendency of a change in a sample average.

The above result indicates that the inspection method can be applied to in-line monitoring for detecting polish nonuniformity. Moreover, the in-line monitoring can be performed in shorter time as compared with the conventional method, so that the distribution in the wafer face can be easily grasped. The inspection method can be applied not only to a pn junction but also to in-line monitoring on all of processes related to formation of a pn junction.

As described above, by using the inspection technique of the invention, the backward bias current characteristics in a wafer face which is in a manufacturing process can be specified automatically at a high speed. By executing the inspection method as in-line monitoring during a manufacturing process, fluctuations and variations in the backward bias current which can be conventionally evaluated only by an electrical test can be detected at an early stage and a countermeasure can be taken in a process. In development of a semiconductor device, a pn junction backward bias current can be evaluated at an early stage, parameters of a process of forming a junction can be optimized very efficiently in short time, so that the invention can largely contribute to shorten the development period.

Although the configuration of a typical system and the inspection method of the invention have been described above by using the flow of a concrete inspection, actions of the components, the flow for determining inspection parameters, and the embodiments of inspection and the method of setting of inspection parameters, the invention can be also applied to an inspection method and an inspection system combining a plurality of features described in claims without departing from the scope of the invention.

Further, although a DRAM has been described in detail as an example in the foregoing embodiment, the invention is not limited to the embodiment. For example, the invention can be applied to all of semiconductor devices each having a pn junction such as a flash memory and a CMOS. The invention can be also applied by using, except for an electron beam, a charged particle beam such as FIB (Focused Ion Beam).

By applying the test technique according to the invention to development of a semiconductor process, inspection on a wafer being in a process, which cannot be conduced by a conventional technique, can be made at an early stage, so that a problem can be accurately immediately grasped. Consequently, efficiency of development of a new product and the like is improved and manufacturing cost can be reduced.

A countermeasure can be taken promptly in a manufacturing process and, as a result, a fraction defective of a semiconductor device and other substrates can be reduced, the development period can be shortened, and productivity can be increased. are specified from a backward bias current.

What is claimed is:

1. An inspection method of a semiconductor device, comprising:
    irradiating a substrate surface of a semiconductor device in which a circuit pattern is formed with a primary charged particle beam a plurality of times at predetermined intervals;
    detecting electron signals secondarily generated from said substrate by irradiation of the primary charged particle beam;
    extracting a potential contrast signal from information of said image displayed;
    specifying electric characteristics of the semiconductor device from said potential contrast signal by processing the following:
        providing a relationship between a number of secondary electrons and a leak current,
        obtaining a relationship between a number of bits and an intensity of the potential contrast signal based on the potential contrast signal extracted,
        obtaining a distribution of normal bit and failure bit with respect to an intensity of the leak current by combining the provided relationship between the secondary electrons and the leak current, and
        converting the intensity of the leak current into a retention time.

2. The inspection method according to claim 1, wherein the circuit pattern formed in said semiconductor device has a pn junction.

3. An inspection method of a semiconductor device including normal position and failure position, comprising:
    irradiating a substrate surface of a semiconductor device in which a circuit pattern is formed with a primary charged particle beam a plurality of times at predetermined intervals at a stage during a wafer process;
    detecting a signal secondarily generated from said substrate by irradiation of the primary charged particle beam;
    displaying an image from said signals detected;
    extracting a potential contrast signal from information of said image displayed; obtaining a sample average and distribution of a plurality of positions to be inspected with respect to a retention time;
    specifying electric characteristics of the semiconductor device from the sample average and distribution.

4. The inspection method according to claim 3, wherein the circuit pattern formed in said semiconductor device has a pn junction.

5. An inspection method of a semiconductor device according to claim 3, further comprising:
    obtaining a sample average and distribution is obtained by carrying out the following:
        providing a relationship between a number of secondary electrons and a leak current;
        obtaining a relationship between a number of bits and an intensity of the potential contrast signal based on the potential contrast signal extracted;
        obtaining a distribution of the number of the bits with respect to an intensity of the leak current by combining the provided relationship between the secondary electrons and the leak current; and
        converting the intensity of the leak current into a retention time.

6. An inspection method of a semiconductor device, comprising:
    irradiating a surface of a semiconductor device having a circuit pattern in which a junction is formed with an electron beam a plurality of times at predetermined intervals under a condition that said junction is backward biased;
    detecting secondary electron signals generated from said semiconductor device by irradiation of said electron beam;
    extracting a potential contrast signal from information of said image displayed;
    providing a relationship between a number of secondary electrons and a leak current,
    obtaining a relationship between a number of the junction and an intensity of the potential contrast signal based on the potential contrast signal extracted;
    obtaining a distribution of normal junction and failure junction with respect to an intensity of the leak current by combining the provided relationship between the secondary electrons and the leak current;
    converting the intensity of the leak current into a retention time; and specifying electric characteristics of the semiconductor device from the distribution of the junction with respect to the retention time.

7. The inspection method according to claim 6, further comprising:
    obtaining a potential contrast signal distribution by extracting said potential contrast signal from a plurality of positions in the semiconductor device; and
    specifying a backward bias current distribution of said junction from said potential contrast distribution,
    wherein electric characteristics of the semiconductor device are specified on the basis of said backward bias current.

8. An inspection method of a semiconductor device, comprising:
    irradiating a substrate surface of a semiconductor device in which a circuit pattern is formed with a primary charged particle beam a plurality of times at predetermined intervals at a stage in a wafer process;
    detecting an electron signal secondarily generated from said substrate surface by irradiation of the primary charged particle beam;
    displaying an image from said electron signals detected; and
    obtaining an inspected bit distribution including normal bit and failure bit with respect to a leak current signal,
    wherein said semiconductor device is specified by using the potential contrast signal distribution of said semiconductor device whose electric characteristics are known, and electric characteristics of said semiconductor device are specified.

9. The inspection method according to claim 8, wherein the circuit pattern formed in said semiconductor device has a pn junction.

10. An inspection method of a semiconductor device according to claim 8, wherein the inspected bit distribution is obtained by:

provviding a relationship between a number of secondary electrons and a leak current;

obtaining a relationship between a number of bits and an intensity of the potential contrast signal based on the potential contrast signal extracted;

obtaining a distribution of the number of the bits with respect to an intensity of the leak current by combining the provided relationship between the secondary electrons and the leak current; and converting the intensity of the leak current into a retention time.

11. An inspection system of a semiconductor device, comprising:

an electron source;

an electron beam irradiating unit for irradiating a substrate of a semiconductor device having a circuit pattern in which a junction is formed with an electron beam;

a sample holder for holding said substrate;

a detector for detecting an electron signal secondarily generated by irradiation of said substrate with the electron beam;

display means for displaying an image of said electron signal detected;

control means for executing a control so as to irradiate said substrate with the electron beam a plurality of times at predetermined intervals; and signal processing means for extracting a potential contrast signal from information of said image displayed and obtaining an inspected bit distribution including normal bit and failure bit with respect to a leak current signal.

12. An inspection system of a semiconductor device according to claim 11, wherein the signal processing means obtains the inspected bit distribution by:

providing a relationship between a number of secondary electrons and a leak current;

obtaining a relationship between a number of bits and an intensity of the potential contrast signal based on the potential contrast signal extracted;

obtaining a distribution of the number of the bits with respect to an intensity of the leak current by combining the provided relationship between the secondary electrons and the leak current; and converting the intensity of the leak current into a retention time.

13. An inspection system of a semiconductor device according to claim 11, wherein electric characteristics of the semiconductor device are specified from a backward bias current.

* * * * *